(12) United States Patent
Aweya et al.

(10) Patent No.: US 7,043,651 B2
(45) Date of Patent: May 9, 2006

(54) TECHNIQUE FOR SYNCHRONIZING CLOCKS IN A NETWORK

(75) Inventors: James Aweya, Nepean (CA); Michel Ouellette, Plantagenet (CA); Delfin Y. Montuno, Kanata (CA); Kent E. Felske, Kanata (CA)

(73) Assignee: Nortel Networks Limited, St. Laurent ( * ) Notice: Subject to any disclaimer, the term of this patent is extended or adjusted under 35 U.S.C. 154(b) by 620 days.

(21) Appl. No.: 10/076,415

(22) Filed: Feb. 19, 2002

(65) Prior Publication Data
US 2003/0056136 A1    Mar. 20, 2003

Related U.S. Application Data

(60) Provisional application No. 60/323,125, filed on Sep. 18, 2001.

(51) Int. Cl.
*G06F 1/12*    (2006.01)
*H04L 7/00*    (2006.01)

(52) U.S. Cl. .................. 713/400; 713/401; 375/356
(58) Field of Classification Search ............... 713/400, 713/500, 600, 401; 375/356, 326, 327, 371; 370/516, 395.62
See application file for complete search history.

(56) References Cited

U.S. PATENT DOCUMENTS

| | | | |
|---|---|---|---|
| 5,486,864 A |  | 1/1996 | Zdepski |
| 5,608,731 A |  | 3/1997 | Upp et al. |
| 5,790,543 A |  | 8/1998 | Cloutier |
| 5,864,248 A | * | 1/1999 | Rokugo .................... 327/156 |
| 5,970,107 A |  | 10/1999 | Bleiweiss et al. |
| 6,449,291 B1 | * | 9/2002 | Burns et al. ............... 370/516 |
| 6,496,553 B1 | * | 12/2002 | Rokugo .................... 375/376 |
| 6,532,274 B1 | * | 3/2003 | Ruffini ..................... 375/356 |
| 6,714,921 B1 | * | 3/2004 | Stefik et al. ............... 705/55 |

FOREIGN PATENT DOCUMENTS

| | | | |
|---|---|---|---|
| JP | 2000201151 A | * | 7/2000 |
| WO | WO 00/48421 | | 1/2000 |

OTHER PUBLICATIONS

IBM, Synchronization of Real Time Clocks, Oct. 1, 1992, IBM Technical Disclosure Bulletin, vol. 35, Issue 5, pp. 172-173.*
William C. Lindsey, Proceedings of the IEEE, vol. 69, No. 4, Apr. 1981, "A Survey of Digital Phase-Locked Loops", 22 pages.
Richard C. Lau, IEEE Transactions On Communications, vol. 43, No. 2,3,4, Feb./Mar./Apr. 1995, "Synchronous Techniques for Timing Recovery in BISDN", pp. 1810-1818.
European Search Report, EP Application No. 02394084.4-2415, dated May 31, 2005.

* cited by examiner

*Primary Examiner*—Chun Cao
*Assistant Examiner*—Suresh K Suryawanshi
(74) *Attorney, Agent, or Firm*—Hunton & Williams LLP

(57) ABSTRACT

A technique for synchronizing clocks in a network is disclosed. In one exemplary embodiment, the technique may be realized as a method for synchronizing clocks in a network. The method comprises receiving a first timestamp and a second timestamp, each indicating a respective time instance as determined by a first clock signal within the network. The method also comprises measuring a first time interval between the first timestamp and the second timestamp. The method further comprises generating a difference signal representing a difference between the first time interval and a second time interval, and generating a second clock signal based upon the difference signal such that the second clock signal is synchronized with the first clock signal.

16 Claims, 17 Drawing Sheets

TECHNIQUE FOR SYNCHRONIZING CLOCKS IN A NETWORK

CROSS-REFERENCE TO RELATED APPLICATIONS

This patent application claims priority to U.S. Provisional Patent Application No. 60/323,125, filed Sep. 18, 2001, which is hereby incorporated by reference herein in its entirety.

FIELD OF THE INVENTION

The present invention relates generally to clock synchronization in a network and, more particularly, to an improved phase-locked loop technique for synchronizing clocks in a network using timestamps.

BACKGROUND OF THE INVENTION

Clock synchronization in a communication network is the means by which a clock signal is generated or derived and distributed through the network and its individual nodes for the purpose of ensuring synchronized network operation. Herein, clocking refers to a process whereby a timing signal is used by a physical interface of a network device to put data on a transmission media as well as extract data from the transmission media. In other words, clocking at a physical interface of a network device controls the speed at which data is transmitted on a physical connection.

Two main performance degradation issues come into play when clocks at a transmitter and a receiver are not synchronized. First, if the physical interfaces along a connection are not synchronized (i.e., not driven by a clocking signal of identical frequency), data can be lost due to buffer overflow or underflow, resulting in periodic line errors. When the physical interfaces are synchronized, then, within a given time window, the same amount of data is transmitted or forwarded at every point in the connection. Second, imperfections in clock synchronization can lead to observable defects on an end service such as bit errors due to alignment jitter when interworking with a plesiochronous digital hierarchy (PDH) or a synchronous digital hierarchy (SDH) network, or frame slips when interworking with a public switched telephone network (PSTN) or an integrated service digital network (ISDN).

The widespread acceptance of packet-switched technologies such as IP/Ethernet and recent advances in high-speed switching and forwarding, and quality of service (QoS) management has made it possible to build converged voice and data networks. By using IP/Ethernet, various services such as voice, video, and data can be multiplexed, switched, and transported together under a universal format. Full integration will likely result in simpler and more efficient network and service administration and management.

However, the demand for high quality real-time multimedia applications requiring strict clock synchronization properties, such as digital television and voice processing, is on the increase. Clock synchronization is an important design consideration in time division multiplexing (TDM) networks, and in packet networks carrying TDM voice or video traffic. TDM data, for instance, must be received and transmitted at the same rate at every hop in a connection. Packet networks that carry pure data traffic that do not require an end-to-end timing relationship (e.g., TCP/IP traffic) need not worry as much about clock quality. IP/Ethernet networks offer essentially an asynchronous transmission service, thus making the synchronization needs of real-time applications difficult to meet in these networks. Unlike packet switched networks, circuit switched networks (which typically use TDM) are engineered to minimize switching and transmission jitter that degrade the quality of voice and data services. Switching and transmission jitter is minimized by synchronizing input and output links at every node via, for example, pulse stuffing techniques.

To interwork with a circuit switched network whose services are pre-dominantly time-sensitive, a packet (e.g., IP) network must essentially behave as a transparent "link" in an end-to-end connection. This transparent inclusion of a packet network in an end-to-end path of a connection that carries circuit-switched time sensitive services is referred to as "circuit emulation" on the packet network. Circuit emulation services (CES) allow a network operator to seamlessly migrate network core infrastructure from circuit switched to packet switched, while preserving the legacy circuit switched end equipment.

A good clock synchronization scheme is essential for the successful deployment of CES. Packet networks that transport voice, video, and/or telephony services also require an end-to-end timing relationship and therefore must have well-designed network clock synchronization mechanisms. Lack of synchronization traceability between TDM equipment interconnected over a packet network may result in frame or byte slips which can affect data integrity. Thus, critical to performance, transmission, data integrity, and ultimately quality of service of any network where TDM and real-time services are supported, is the manner by which the various network equipment derive and maintain synchronization.

There are three broad categories of clock synchronization in a packet network. First, in a network synchronous approach, all devices are clocked from a common clock or primary reference source (PRS). This offers the best clock quality, but can be expensive since the network requires a PRS and a clock distribution service, except in toll-bypass networks where there is a PRS at each end of the packet network. The regulatory constraints may also make this approach impractical.

Second, a transmitter and a receiver may be clocked independently. That is, usually the clocks at the transmitter and receiver will have the same nominal frequency but differ in their amounts of random variation from the nominal values (e.g., in parts per million, ppm). In this case, the transmitter sends data out with a locally generated, independent clock and any difference that might occur between the receiver and transmitter clocks is taken up with a "slip buffer" which can insert or delete bits from the data stream if the need arises. This technique cannot guarantee the bit level integrity of the data unless the transmitter and receiver clocks are synchronized with each other.

Third, a receiver may derive an estimate of the transmitter clock from the received data stream. This is commonly done using a phase-locked loop (PLL) that slaves the receiver clock to a transmitter clock. The PLL is able to process transmitted clock samples encoded within the data stream, or process data arrival patterns to generate a timing signal for the receiver. The purpose of the PLL is to estimate and compensate for the frequency drift occurring between the oscillators of the transmitter clock and the receiver clock. Unfortunately, the presence of transmission jitter affects the performance of the clock estimation/compensation process, making the transmitter clock appear faster or slower than it actually is, and ultimately, causing the propagation of some residual jitter to the receiver clock signal. The presence of even a modest amount of jitter makes the clock recovery problem difficult. The design of the PLL must ensure that clock impairments are within acceptable limits for the intended applications.

At a receiver, application-specific requirements for parameters such as accuracy, stability, jitter, and wander determine the approach that should be taken to recover a transmitter clock. One approach, called the timestamp method, falls into the third category discussed above. The timestamp method is typically used when a common reference clock is not available as in some local networks and in networks that offer asynchronous services (e.g., IP/Ethernet networks). The timestamp method may also be used when user data traverses a number of different networks and it may not be possible to provide a common network clock to transmitting and receiving end-stations.

In the timestamp method, a transmitter sends an explicit time indication or timestamp (e.g., in a packet with or without user data) to a receiver so that it can synchronize its local clock to that of the transmitter. Since no common network clock is used, the receiver relies on locking a recovered clock to the arrival of the timestamp patterns. The timestamp method is analogous to periodically inserting synchronizing patterns into a bit stream at a transmitter. At a receiver, the synchronizing patterns are detected and used to generate a reference signal for a PLL.

In real-time data transmission, for example, to synchronize non-periodically transmitted data (e.g., possibly due to data compression or silence suppression as in voice traffic), the timestamp method uses a monotonic clock. This monotonic clock is usually incremented in time units that are smaller than the smallest block size of the data stream. The initial monotonic clock value can be random.

Referring to FIG. 1, there is shown a communication system 10 which implements a clock synchronization scheme based upon the timestamp method. The communication system 10 comprises a transmitter 12, a receiver 14, and a network 16 through which packets 17 are sent from the transmitter 12 to the receiver 14. The transmitter 12 comprises a network adaptor 18 and a transmitter clock 20. The transmitter clock 20 comprises an oscillator 22 and a first pulse counter 24. The receiver 14 comprises a jitter buffer 26 and a receiver clock 28. The receiver clock 28 comprises a phase-locked loop (PLL) 30 having a differencing element 32, a loop filter 34, and a local clock 36. The local clock 36 comprises a voltage controlled oscillator (VCO) (or digitally controlled oscillator (DCO)) 38 and a second pulse counter 40.

The clock synchronization scheme implemented in the communication system 10 allows multiple receivers (e.g., in a broadcast or point-to-multipoint communication scenario) to synchronize their clocks to that of the transmitter clock generated by the oscillator 22. The oscillator 22 issues periodic pulses that are input to the first pulse counter 24. The oscillator 22 has a frequency that is the inverse of the interval between consecutive pulses (i.e., the oscillator period). The output of the first pulse counter 24 represents the transmitter clock signal and is incremented by a fixed amount at each pulse. Samples of transmitter clock are communicated to the receiver 14 in packets 17 as timestamps.

At the receiver 14, the PLL 30 uses the timestamps (which constitute the PLL reference signal) to synchronize with the transmitter clock. At the differencing element 32, an error signal is generated from the difference between the reference signal (i.e., the timestamps) and a feedback signal from the second pulse counter 40. The error signal is passed on to the loop filter 34, which is responsible for eliminating possible jitter and noise in received input signals. The VCO (or DCO) 38, which typically has a center frequency, oscillates at a frequency which is determined by an output signal of the loop filter 34.

Ideally, there is a constant delay between the transmitter 12 and the receiver 14, and the timestamp values arriving at the receiver 14 are all consistent. However, this is not the case in packet networks. Rather, delay variation between the transmitter 12 and the receiver 14 occurs in packet networks. This delay variation complicates the clock synchronization problem because it effectively introduces network jitter to the timestamps that are generated at the transmitter 12 and received at the receiver 14. FIGS. 2A and 2B illustrate how delay variation (i.e., network jitter) occurs in the system 10. FIG. 3 illustrates how delay variation (i.e., network jitter), as well as other forms of jitter, are introduced (figuratively via summing junction 42) to timestamps that are generated at the transmitter 12 and later received at the PLL 30 of the receiver 14.

There are three main contributors to jitter seen at the receiver 14. The first contributor is due to frequency drift between the clocks in the transmitter 12 and the receiver 14. This contribution is usually small compared to the other two contributors. The second contributor is due to packetization at the transmitter 12, which may displace timestamp values within a packet stream. Lastly, the third contributor is due to packet multiplexing and variations in queuing delays in network switches.

If a significant amount of jitter is passed on to the recovered clock, its quality may degrade (i.e., the PLL 30 may not provide a sufficiently stable clock signal). As a result, the PLL 30 must perform filtering in order to correctly estimate the transmitter clock. However, the design of the PLL 30 must be such that its filtering capabilities do not slow the responsiveness of the PLL 30 and increase the amount of time it requires to estimate the transmitter clock. This is because slow PLL responsiveness and increased transmitter clock estimation time affect the maximum phase error between the transmitter time-line and the receiver time-line which in turn increases the amount of memory in the receiver 14 that must be allocated to hold unread data. The receive (jitter) buffer 26 also has to be at least the size of the jitter amplitude (statistical bound) that the receiver 14 wants to absorb. Otherwise, packets that experience more delay than the maximum jitter amplitude are discarded.

In view of the foregoing, it would be desirable to provide a technique for synchronizing clocks in a network in an efficient and cost effective manner which overcomes the above-described inadequacies and shortcomings.

SUMMARY OF THE INVENTION

According to the present invention, a technique for synchronizing clocks in a network is provided. In one exemplary embodiment, the technique may be realized as a method for synchronizing clocks in a network. The method comprises receiving a first timestamp and a second timestamp, each indicating a respective time instance as determined by a first clock signal within the network. The method also comprises measuring a first time interval between the first timestamp and the second timestamp. The method further comprises generating a difference signal representing a difference between the first time interval and a second time interval, and generating a second clock signal based upon the difference signal such that the second clock signal is synchronized with the first clock signal.

In accordance with other aspects of this exemplary embodiment of the present invention, the method may further beneficially comprise generating a third timestamp and a fourth timestamp, each indicating a respective time instance as determined by the second clock signal. If such is the case, the method may still further beneficially comprise measuring the second time interval between the third timestamp and the fourth timestamp. The first timestamp and the third timestamp may each be beneficially generated at a first discrete time instant, and the second timestamp and the fourth timestamp may each be beneficially generated at a second discrete time instant.

In accordance with further aspects of this exemplary embodiment of the present invention, the method may further beneficially comprise initializing the difference signal prior to receiving the first timestamp and the second timestamp.

In accordance with still further aspects of this exemplary embodiment of the present invention, the method may further beneficially comprise filtering the difference signal such that the second clock signal is synchronized with the first clock signal based upon a filtered difference signal. If such is the case, the method may still further beneficially comprise initializing the filtered difference signal prior to receiving the first timestamp and the second timestamp.

In accordance with additional aspects of this exemplary embodiment of the present invention, generating the second clock signal may beneficially comprise controlling the period of a digitally controlled oscillator based upon the difference signal. Alternatively, generating the second clock signal may beneficially comprise converting the difference signal from a digital difference signal value into analog difference signal value, and controlling the period of a voltage controlled oscillator based upon the analog difference signal value.

In another exemplary embodiment, the technique may be realized as a computer signal embodied in a carrier wave readable by a computing system and encoding a computer program of instructions for executing a computer process performing the above-described method.

In a further exemplary embodiment, the technique may be realized as an apparatus for synchronizing clocks in a network. The apparatus comprises a receiver for receiving a first timestamp and a second timestamp, each indicating a respective time instance as determined by a first clock signal within the network. The apparatus also comprises a phase-locked loop associated with the receiver. The phase-locked loop comprises a first differencing element for measuring a first time interval between the first timestamp and the second timestamp, a second differencing element for generating a difference signal representing a difference between the first time interval and a second time interval, and a variable oscillator for generating a second clock signal based upon the difference signal such that the second clock signal is synchronized with the first clock signal.

In accordance with other aspects of this exemplary embodiment of the present invention, the apparatus may further beneficially comprise a pulse counter for generating a third timestamp and a fourth timestamp each indicating a respective time instance as determined by the second clock signal. If such is the case, the apparatus may still further beneficially comprise a third differencing element for measuring the second time interval between the third timestamp and the fourth timestamp. The first timestamp and the third timestamp may each be beneficially generated at a first discrete time instant, and the second timestamp and the fourth timestamp may each be beneficially generated at a second discrete time instant.

In accordance with further aspects of this exemplary embodiment of the present invention, the second differencing element may beneficially initialize the difference signal prior to receiving the first timestamp and the second timestamp.

In accordance with still further aspects of this exemplary embodiment of the present invention, the apparatus may further beneficially comprise a loop filter for filtering the difference signal such that the second clock signal is synchronized with the first clock signal based upon a filtered difference signal. If such is the case, the loop filter may beneficially initialize the filtered difference signal prior to receiving the first timestamp and the second timestamp.

In accordance with additional aspects of this exemplary embodiment of the present invention, the variable oscillator may beneficially be a digitally controlled oscillator the period of which is controlled based upon the difference signal. Alternatively, the apparatus may further beneficially comprise a digital-to-analog converter for converting the difference signal from a digital difference signal value into analog difference signal value, wherein the variable oscillator may beneficially be a voltage controlled oscillator the period of which is controlled based upon the analog difference signal value.

In a still further exemplary embodiment, the technique may be realized as an article of manufacture for synchronizing clocks in a network. The article of manufacture comprises at least one processor readable carrier, and instructions carried on the at least one carrier. The instructions are configured to be readable from the at least one carrier by at least one processor and thereby cause the at least one processor to operate so as to receive a first timestamp and a second timestamp, each indicating a respective time instance as determined by a first clock signal within the network. The instructions further cause the at least one processor to operate so as to measure a first time interval between the first timestamp and the second timestamp. The instructions still further cause the at least one processor to operate so as to generate a difference signal representing a difference between the first time interval and a second time interval, and generate a second clock signal based upon the difference signal such that the second clock signal is synchronized with the first clock signal.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

Figure 4:
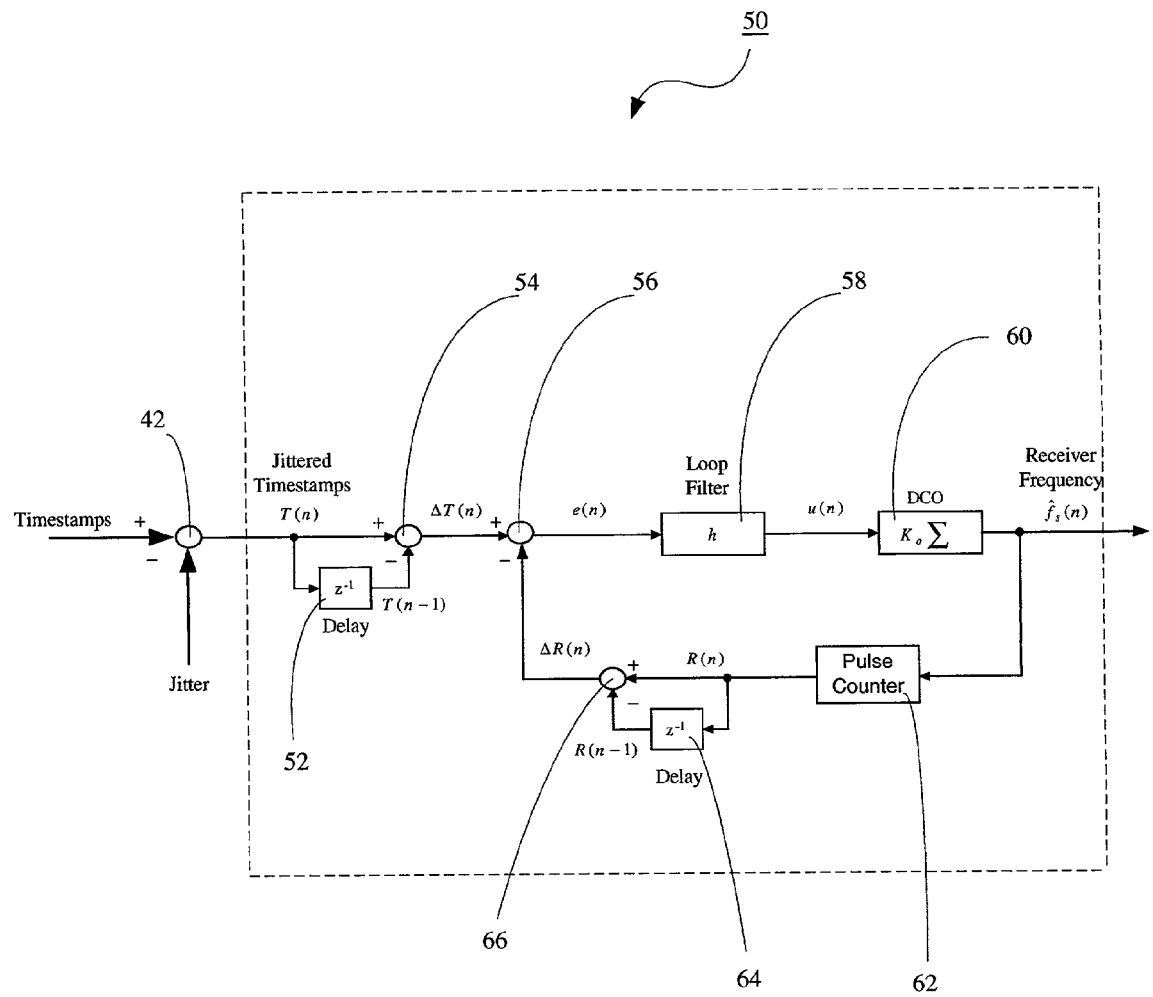
FIG. 4 shows an improved phase-locked loop (PLL) that uses differences in timestamps to perform clock synchronization in accordance with the present invention.

Referring to FIG. 4, there is shown an improved phase-locked loop (PLL) 50 that uses differences in timestamps to perform clock synchronization in accordance with the present invention. The improved PLL 50 comprises a first delay element 52, a first differencing element 54, a second differencing element 56, a loop filter 58, a digitally controlled oscillator (DCO) 60, a pulse counter 62, a second delay element 64, and a third differencing element 66.

Figure 1:
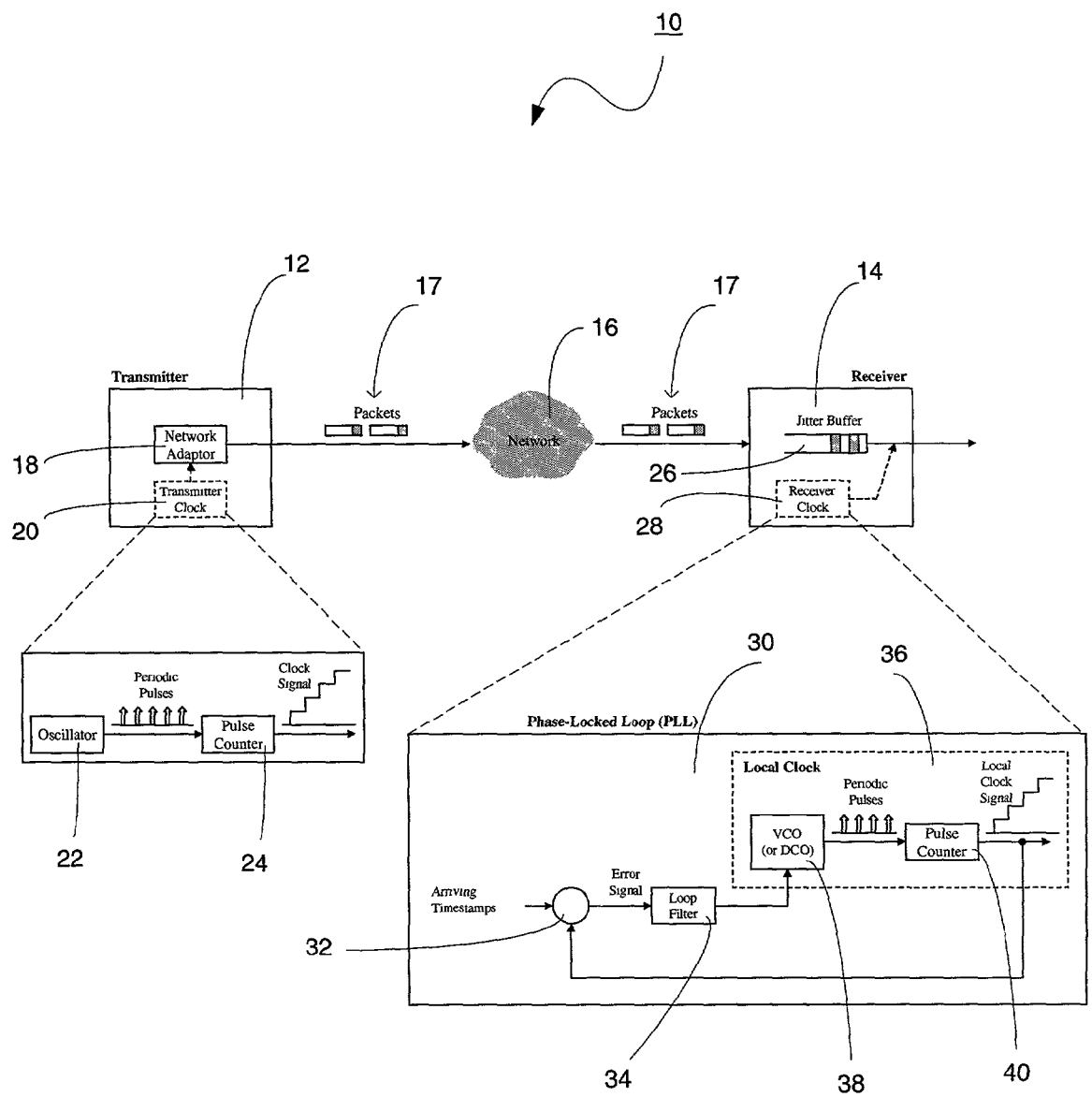
FIG. 1 shows a communication system which implements a clock synchronization scheme based upon the timestamp method.
Figure 2A:
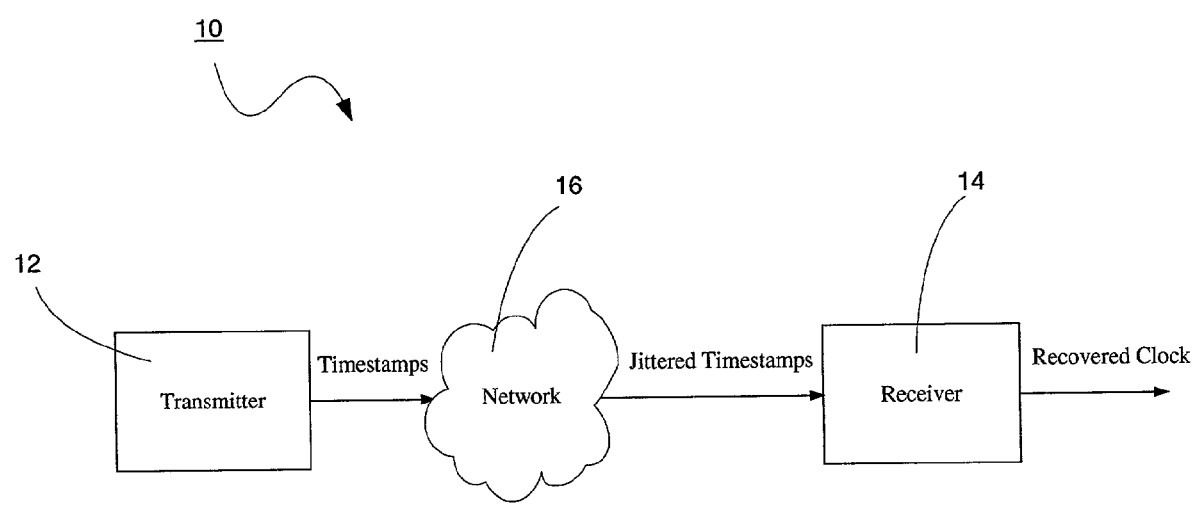
FIGS. 2A and 2B illustrate delay variation (i.e., network jitter) in the communication system shown in FIG. 1.
Figure 2B:
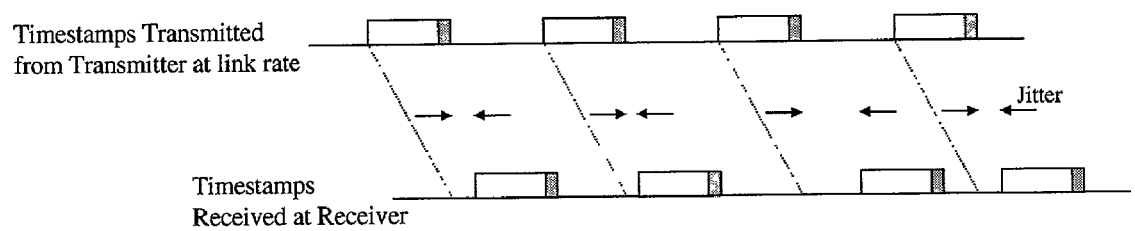
Figure 3:
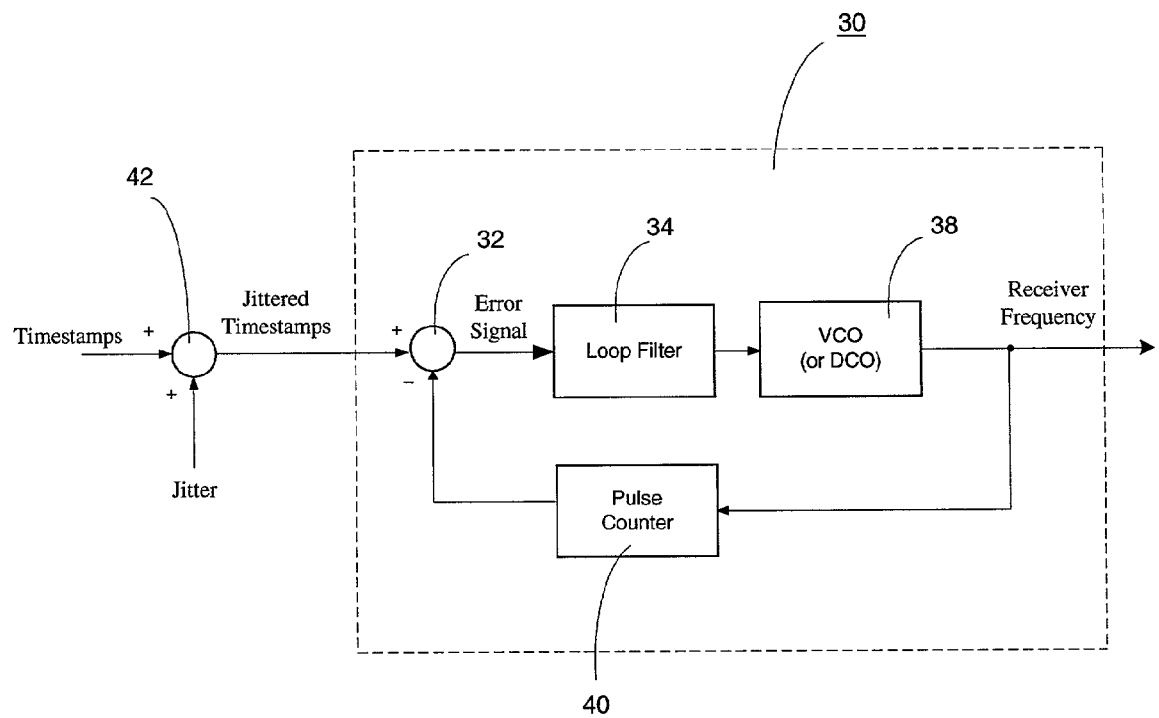
FIG. 3 illustrates how jitter is introduced to timestamps that are later received at a phase-locked loop (PLL) of a receiver in the communication system shown in FIG. 1.

Similar to FIG. 3, FIG. 4 shows how jitter is introduced (figuratively via summing junction 42) to timestamps that are generated at a transmitter and later received at the improved PLL 50, which is located at a receiver. As indicated above, the introduced jitter is mainly caused by frequency drift between transmitter and receiver clocks, timestamp packetization, and packet multiplexing and variations in queuing delays in network switches.

It should be assumed that both the transmitter and the receiver have their own time bases which are driven by local clocks that are used in the transmission and reception of data. Let T(n) denote the time base (in clock pulses) of the transmitter, which operates at a local clock frequency of $f_s = 1/\tau_s$ Hz. Let R(n) denote the time base (in clock pulses as counted by pulse counter 62) of the receiver, which operates at a local clock frequency $\hat{f}_s = 1/\hat{\tau}_s$ Hz. These two functions correspond to the timestamps of the two clocks at discrete time instants n.

The local clock of the receiver (i.e., a local oscillator at the receiver) always has some frequency deviation (which is not constant) from its nominal frequency. Thus, the transmitter time base, T(n), and the receiver time base, R(n), are typically not be the same. Also, when timestamps are transmitted from the transmitter over a packet network, they will arrive at the receiver with variable delay. Thus, if d(n) and d(n−1) denote the delay experienced by the nth and n−1th timestamp arriving at the receiver, respectively, then the jitter induced by the network may be defined as j(n)=Δd(n)=d(n)−d(n−1).

Figure 5:
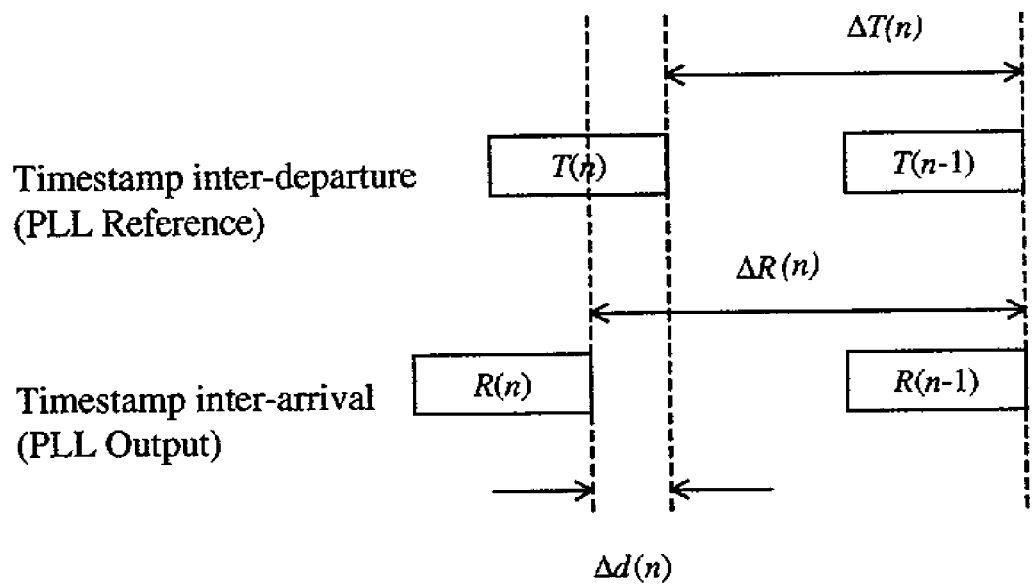
FIG. 5 shows how jitter affects the relationship between the timestamp difference between the nth and n−1th generated timestamp at a transmitter and the timestamp difference between the nth and n−1th timestamp arrivals at a receiver in accordance with the present invention.

The timestamp difference between the nth and n−1th generated timestamp at the transmitter may be defined as ΔT(n)=T(n)−T(n−1). At the receiver, this timestamp difference is generated by the first delay element 52 and the first differencing element 54. Also at the receiver, the timestamp difference between the nth and n−1th timestamp arrivals as measured by the receiver clock may be defined as ΔR(n)=R(n)−R(n−1). This timestamp difference is generated by the second delay element 64 and the third differencing element 66. The variables ΔT(n) and ΔR(n), as well as j(n)=Δd(n), are all illustrated in FIG. 5.

It should be noted that the timestamp difference measured by the receiver also includes the jitter introduced between the nth and n−1th timestamp arrivals. Thus, the timestamp difference between the nth and n−1th timestamp arrivals as measured by the receiver clock may also be defined as ΔR(n)=ΔT(n)+j(n).

The second differencing element 56 operates to take the difference between ΔT(n) and ΔR(n), thereby forming an error signal that may be defined by e(n)=ΔT(n)−ΔR(n). This error signal is filtered by the loop filter 58. The loop filter 58 generates an output signal represented by u(n), which is used by the DCO 60 for controlling the local clock frequency, $\hat{f}_s$, of the receiver. The DCO 60 has a gain represented by $K_o$.

In view of the foregoing, it is clear that the function of the improved PLL 50 is to control the local clock frequency, $\hat{f}_s$, of the receiver such that the error signal, e(n), equals zero, at which point the local clock frequency, $\hat{f}_s$, of the receiver equals the local clock frequency, $f_s$, of the transmitter. This is accomplished by making the difference between the transmitter timestamp differences ΔT(n) and the receiver timestamp differences ΔR(n) to equal zero. That is, while filtering out jitter, the local clock frequency, $\hat{f}_s$, of the receiver is controlled such that the receiver timestamp differences ΔR(n) are equal to the transmitter timestamp differences ΔT(n).

Figure 6:
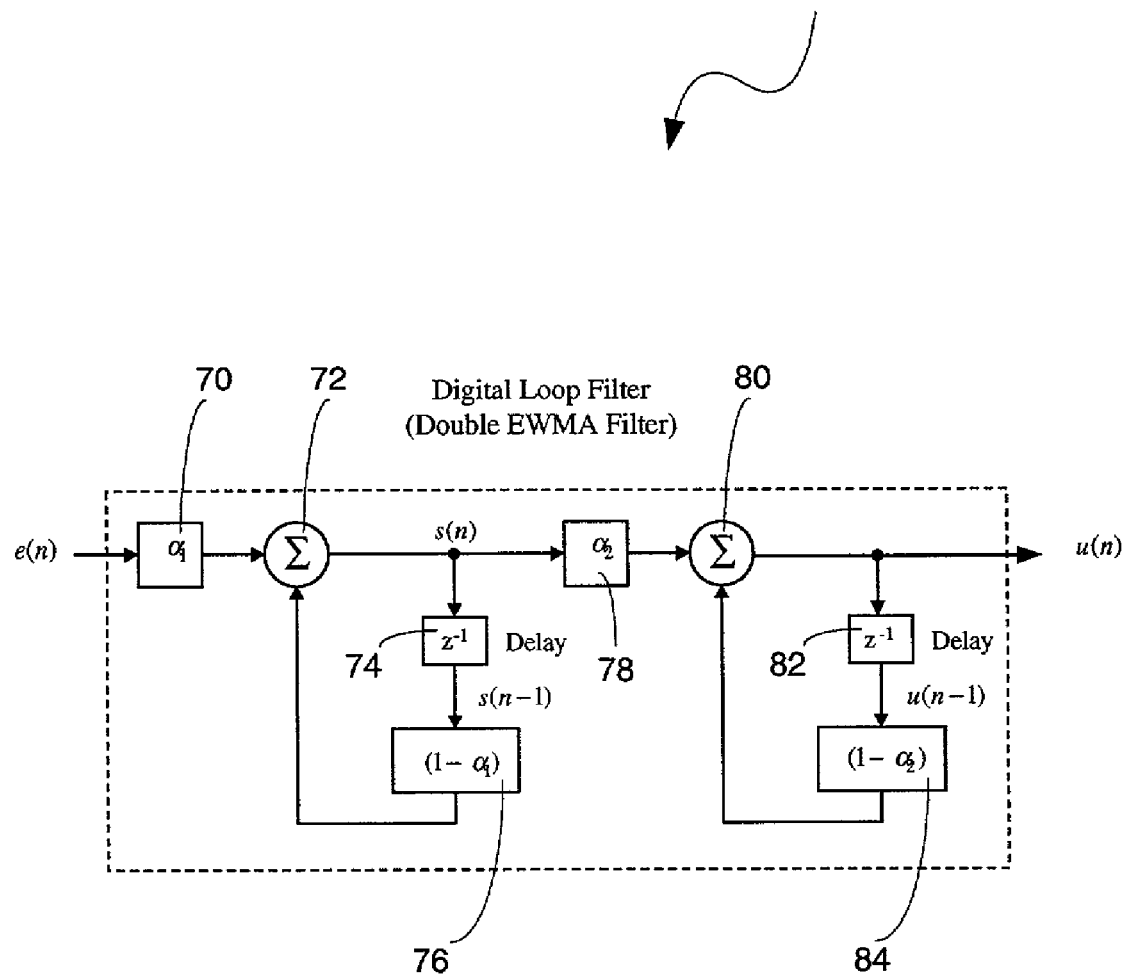
FIG. 6 shows a double exponentially weighted moving average (EWMA) filter in accordance with the present invention.

The loop filter 58, which filters the error term e(n)=ΔT(n)−ΔR(n), is a crucial element in the improved PLL 50. As such, the loop filter 58 is preferably a low-pass filter, such as an exponentially weighted moving average (EWMA) filter (preferably a double EWMA filter). A double EWMA (or a double integral) filter 58, which is shown in FIG. 6, has the following form:

$$s(n) = (1-\alpha_1)s(n-1) + \alpha_1 e(n)$$

$$u(n) = (1-\alpha_2)u(n-1) + \alpha_2 s(n)$$

where $0<\alpha_1,\alpha_2<1$. The transfer function of the double EWMA filter 58 is given by:

$$H(z) = \frac{U(z)}{E(z)} = \frac{\alpha_1 z}{z-(1-\alpha_1)} \cdot \frac{\alpha_2 z}{z-(1-\alpha_2)} = \frac{\alpha_1 \alpha_2 z^2}{z^2 - (\beta_1+\beta_2)z + \beta_1\beta_2},$$

where $\beta_1=1-\alpha_1$ and $\beta_2=1-\alpha_2$.

Specifically, the double EWMA filter 58 shown in FIG. 6 comprises a first gain element ($\alpha_1$) 70, a first summing junction 72, a first delay element 74, a second gain element $(1-\alpha_1)$ 76, a third gain element ($\alpha_2$) 78, a second summing junction 80, a second delay element 82, and a fourth gain element $(1-\alpha_2)$ 84.

To explain why a suitably chosen low-pass filter such as a double integral filter can be used as the loop filter 58, consider the expression $\Delta R(n)=\Delta T(n)+j(n)$, where $j(n)=d(n)-d(n-1)$, as indicated above. The network delays $d(n)$ are assumed to be independent identically distributed (i.i.d.) random variables with a mean, $\mu_d$ and a variance, $\sigma_d^2$. The jitter function, $j(n)$, has a mean, $\mu_j$, which may be defined by $\mu_j=E[j(n)]=0$, and an autocorrelation, $R_j(k)$, which may be defined by:

$$R_j(k) = E[j(n+k)j(n)]$$
$$= E[d(n+k)d(n)] - E[d(n+k)d(n-1)] -$$
$$E[d(n+k-1)d(n)] + E[d(n+k-1)d(n-1)]$$
$$= 2R_d(k) - R_d(k+1) - R_d(k-1)$$
$$= \begin{cases} 2(\sigma_d^2+\mu_d^2), & k=0 \\ -(\sigma_d^2+\mu_d^2), & k=\pm 1 \\ 0, & \text{otherwise} \end{cases}$$

The jitter function, $j(n)$, also has a power spectral density, $S_j(f)$, which may be defined by:

$$S_j(f) = \sum_{k=-1}^{1} R_j(k)e^{-i2\pi fk} = \eta(2 - e^{i2\pi f} - e^{-i2\pi f}) = 2\eta(1-\cos 2\pi f),$$

where $\eta = \sigma_d^2 + \mu_d^2$.

Figure 7:
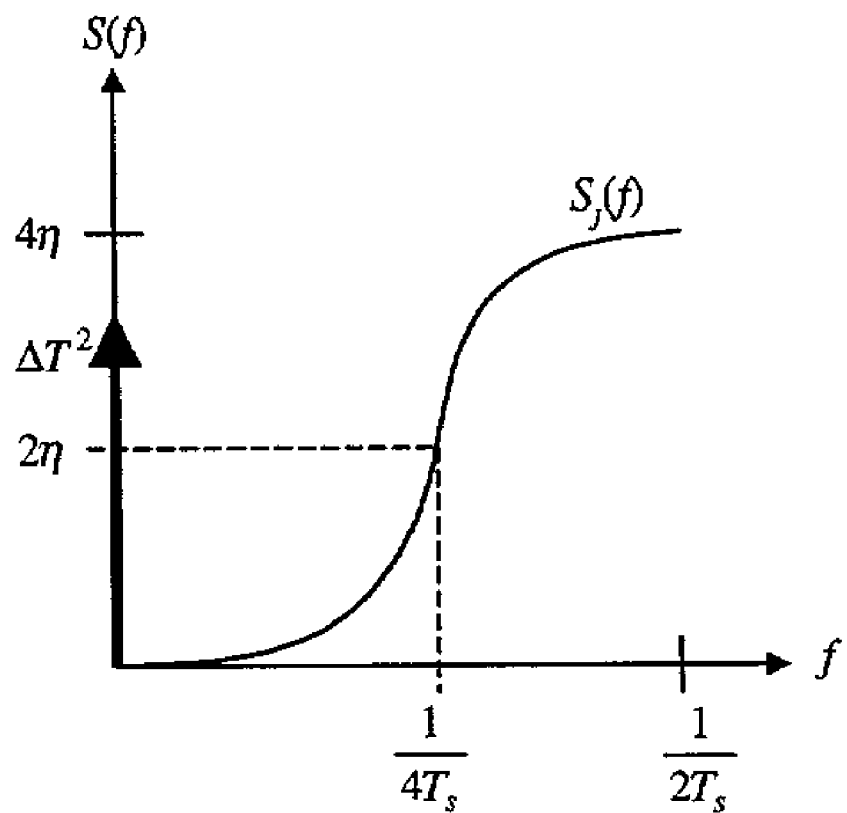
FIG. 7 shows the power spectral density of a timestamp difference function at a receiver in accordance with the present invention.

Without loss of generality, assume that the transmitter generates timestamps with a constant interval of $\Delta T$ (i.e., $\Delta T$ is constant for all n). Then the z-transform and the power spectral density of $\Delta R(n)$ may be defined by:

$$\Delta R(z) = \Delta T + j(z)$$

$$S_{\Delta R}(f) = \Delta T^2 \delta(f) + S_j(f) = \Delta T^2 \delta(f) + 2\eta(1-\cos 2\pi fT_s)$$

which uses the fact that the Fourier transform of a constant is a delta function and $T_s$ is the sampling period, which in this case is equal to the inter-timestamp period $\Delta T$. As shown in FIG. 7, the power spectral density, $S_{\Delta R}(f)$, contains a DC component equal to the timestamp generation interval and the spectrum of the jitter function.

Figure 8A:
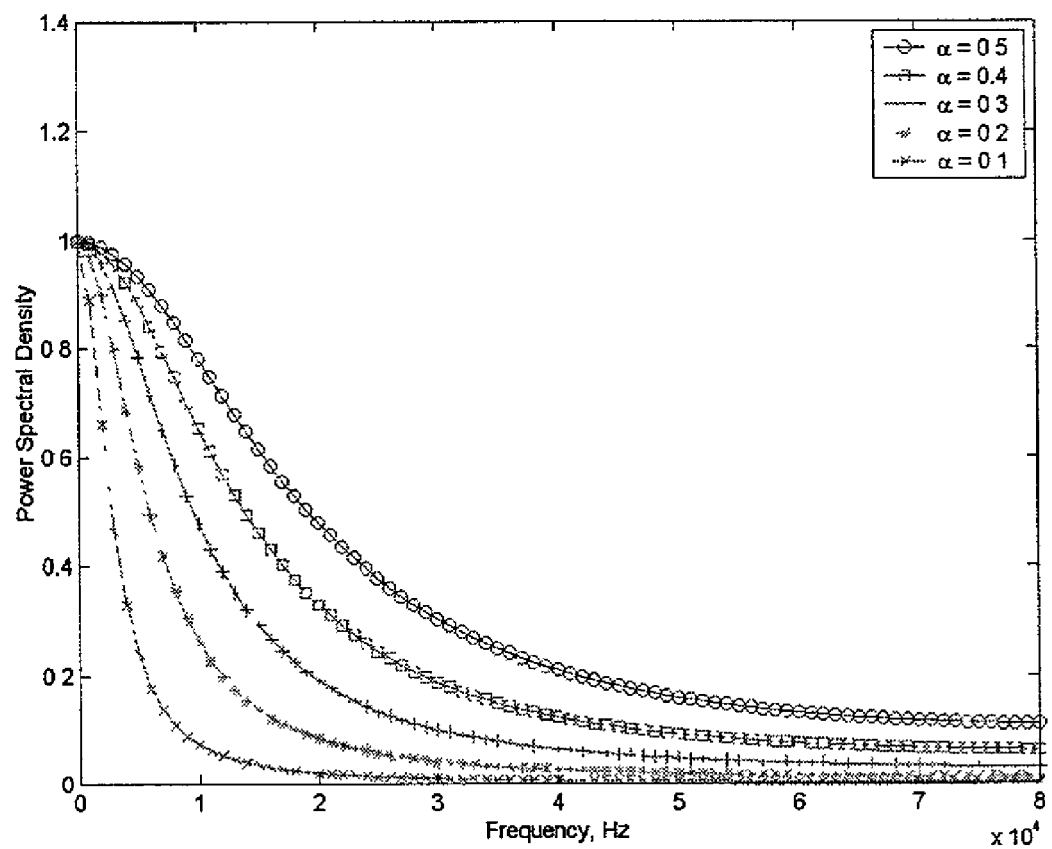
FIG. 8A shows the power spectral density of the single EWMA filter in accordance with the present invention.
Figure 8B:
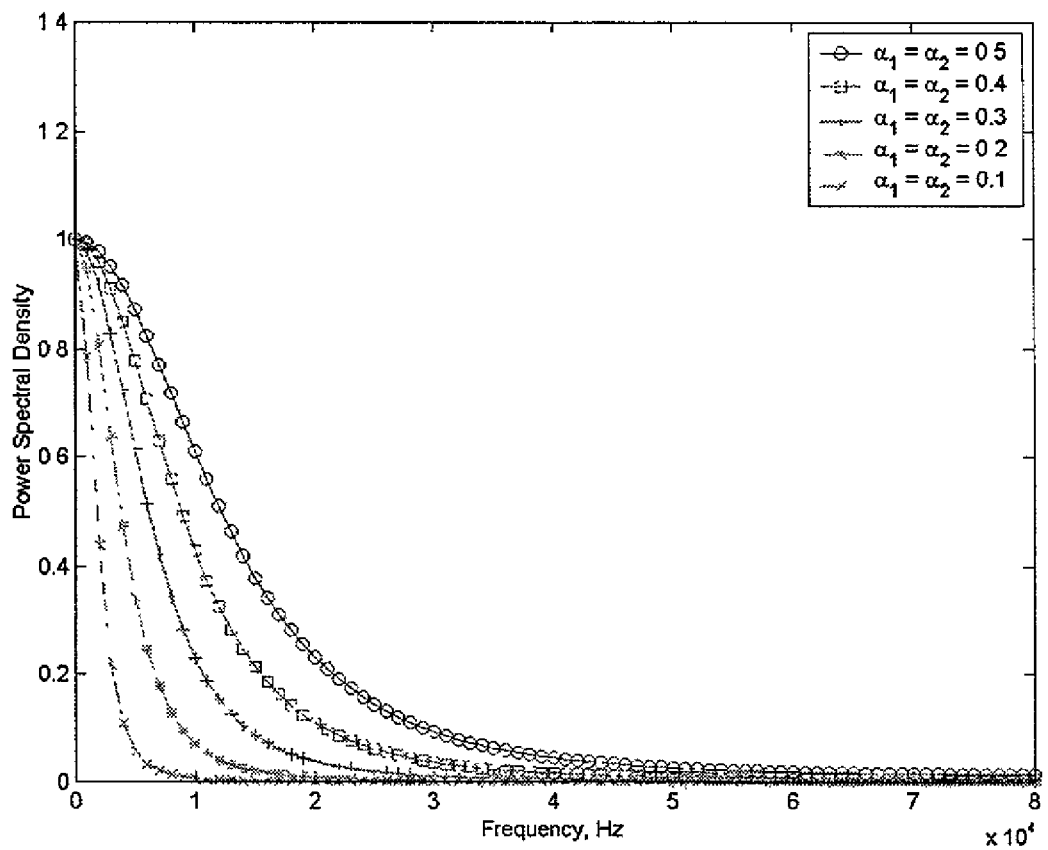
FIG. 8B shows the power spectral density of the double EWMA filter in accordance with the present invention.

Given the transfer functions of the single and double EWMA filters, the normalized (by input variance) output power spectral density of the filters may be defined by:

$$S_{S-EWMA}(f) =$$
$$H_{S-EWMA}(f)H^*_{S-EWMA}(f) = |H_{S-EWMA}(f)|^2 = \frac{\alpha^2}{1+\beta^2 - 2\beta\cos 2\pi fT_s},$$

$$S_{D-EWMA}(f) = |H_{D-EWMA}(f)|^2$$
$$= \frac{\alpha_1^2 \alpha_2^2}{1+(\beta_1+\beta_2)^2 + \beta_1^2\beta_2^2 - 2(\beta_1+\beta_2)\cos 2\pi fT_s - 2(\beta_1+\beta_2)\beta_1\beta_2\cos 2\pi fT_s + 2\beta_1\beta_2\cos 4\pi fT_s}$$

where * denotes the complex conjugate and $\beta=1-\alpha$. FIG. 8A shows the power spectral density of the single EWMA filter, and FIG. 8B shows the power spectral density of the double EWMA filter.

Because the jitter contribution at DC is zero, theoretically, by using an appropriate low-pass filter to remove the jitter in the high-frequency region, the period (frequency) of timestamp generation can be estimated to an arbitrary degree of accuracy.

Although the improved PLL 50 may operate with either a VCO or a DCO, the DCO 60 is preferred based upon the digital nature of the timestamp signals. The function of the DCO 60 is similar to that of a VCO in an analog PLL. The time period of the DCO 60 is controlled directly. The output of the loop filter 58 in the form of a correction (or control) signal, is used to control the period of the DCO 60 in such a way as to decrease the error signal, e(n).

Figure 9A:
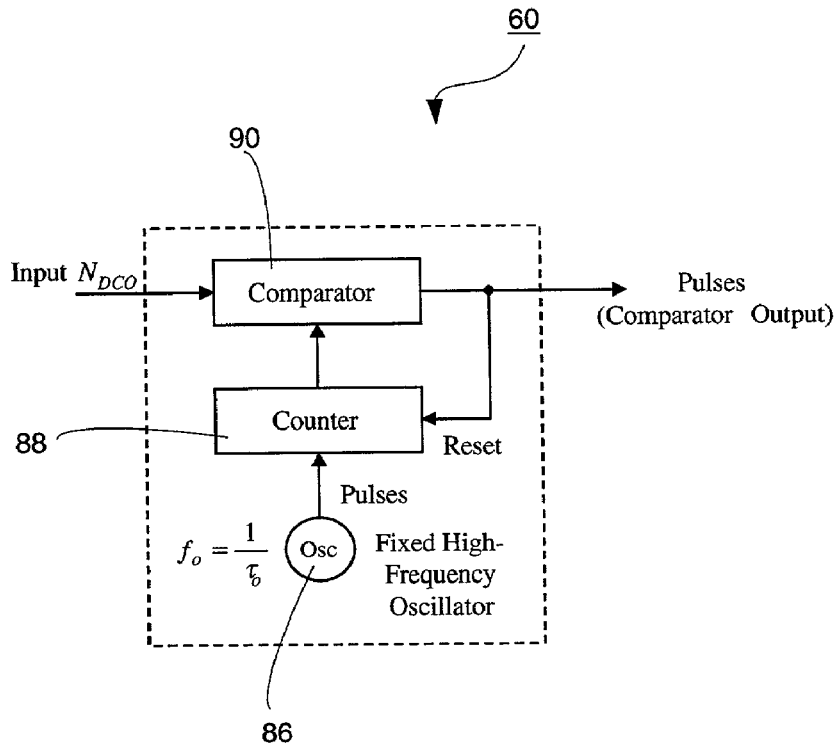
FIG. 9A shows a partial functional block diagram of a digitally controlled oscillator (DCO) in accordance with the present invention.
Figure 9B:
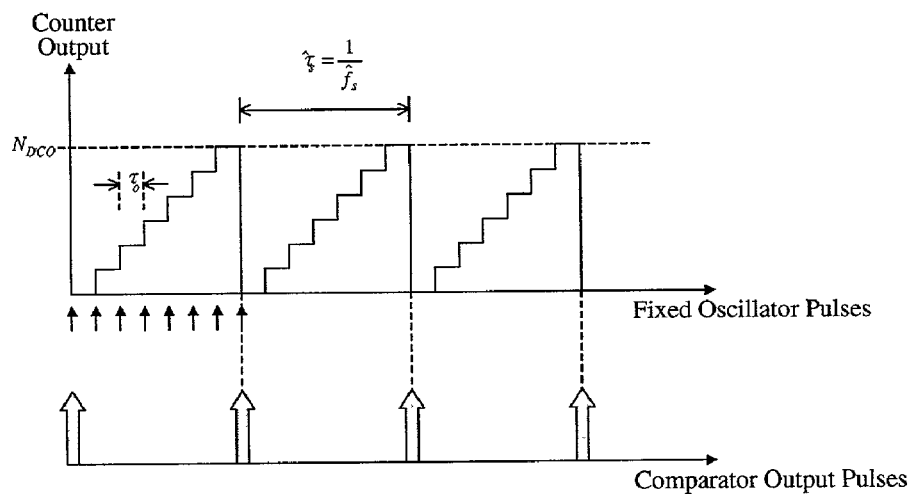
FIG. 9B shows the operation of the DCO shown in FIG. 9A in accordance with the present invention.

Referring to FIG. 9A, there is shown a partial functional block diagram of the DCO 60. The DCO 60 comprises an oscillator 86, a pulse counter 88, and a comparator 90. The DCO 60 behaves essentially as a programmable divide by N element. The oscillator 86 generates output clock pulses (usually at a frequency M times the nominal frequency, where M determines the phase error resolution), which are used to drive the pulse counter 88. The pulse counter 88 is increased by one for every clock pulse received from the oscillator 86. The comparator 90 compares the count of the pulse counter 88 with a control input value $N_{DCO}$. When the count of the pulse counter 88 and the control input value $N_{DCO}$ match, the comparator 90 outputs a pulse which serves both as an output for the DCO 60 and a reset signal for the pulse counter 88. By varying the control input value $N_{DCO}$, the period of the DCO 60 can be controlled. The operation of the DCO 60 as just described is illustrated in FIG. 9B.

Figure 10:
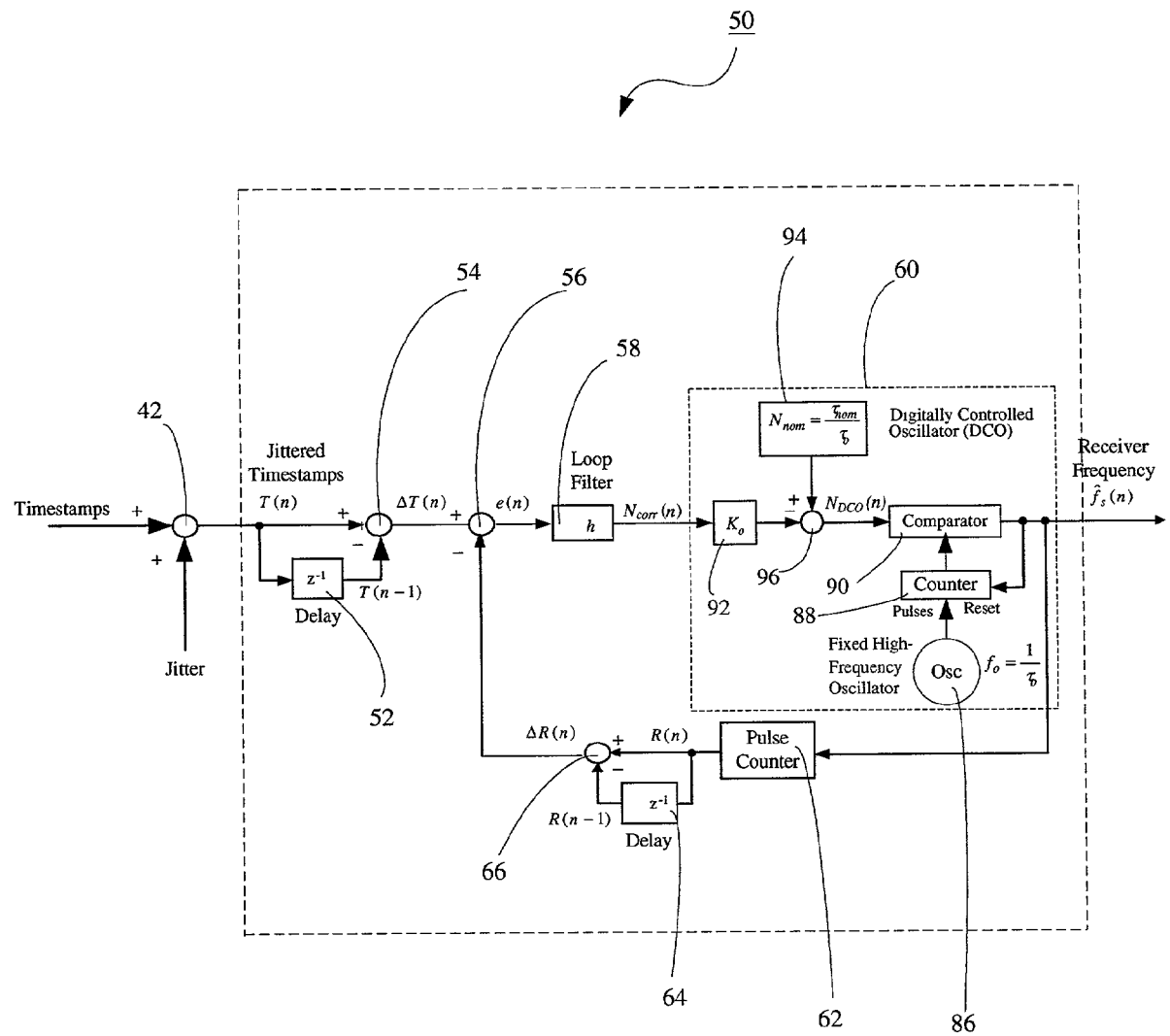
FIG. 10 shows a more detailed functional block diagram of the improved PLL shown in FIG. 4.

Referring to FIG. 10, there is shown a more detailed functional block diagram of the improved PLL 50. In this more detailed functional block diagram, the DCO 60 is shown additionally comprising a DCO gain element 92, a reference generator 94, and a differencing element 96. As previously indicated, the gain of the DCO 60 is represented by $K_o$. The nominal period of the transmitter and receiver clocks may be represented by $\tau_{nom}$, and the nominal frequency of the transmitter and receiver clocks may be represented by $f_{nom}=1/\tau_{nom}$. Thus, the clock period of the DCO 60 may be expressed in terms of the nominal clock period $\tau_{nom}$ as follows:

$$\tau_{DCO}(n) = \tau_{nom} - \tau_{corr}(n-1),$$

where $\tau_{corr}(n-1)$ is the correction or control signal in the $(n-1)$th timestamp arrival instant. It should be noted that $\tau_{nom}$ is the basic clock period in the absence of the correction signal.

In the improved PLL 50, the output of the loop filter 58 is used to control the period of the DCO 60. If the high-frequency oscillator 86 of the DCO 60 has a period equal to $\tau_o = \tau_{nom}/N_{nom}$, then the clock period of the DCO 60 may be expressed in terms of the nominal clock period, $\tau_{nom}$, and the correction factor as follows:

$$\tau_{DCO}(n) = \tau_{nom} - \tau_{corr}(n-1)$$

$$= N_{nom}\tau_o - K_o N_{corr}(n-1)\tau_o$$

$$= [N_{nom} - K_o N_{corr}(n-1)]\tau_o$$

where $\tau_{corr}(n-1) = K_o N_{corr}(n-1)\tau_o$ and $u(n-1) = N_{corr}(n-1)$ is the loop filter output. The DCO 60 generates an output signal, $\hat{f}_s(n) = 1/\hat{\tau}_s(n) = 1/\tau_{DCO}(n)$, which gives an estimate of the transmitter clock frequency, $f_s = 1/\tau_s$.

In the DCO 60, the phase error which may occur due to frequency quantization is:

$$\frac{\Delta\varphi}{\tau_o} = \frac{2\pi}{\tau_{nom}}$$

or $$\Delta\varphi = \frac{2\pi f_{nom}}{f_o} = \frac{2\pi}{N_{nom}} = \frac{360°}{N_{nom}}$$

For small quantization errors, for example, $\Delta\varphi \leq 7.2°$ requires that $N_{nom} \geq 50$.

Figure 11:
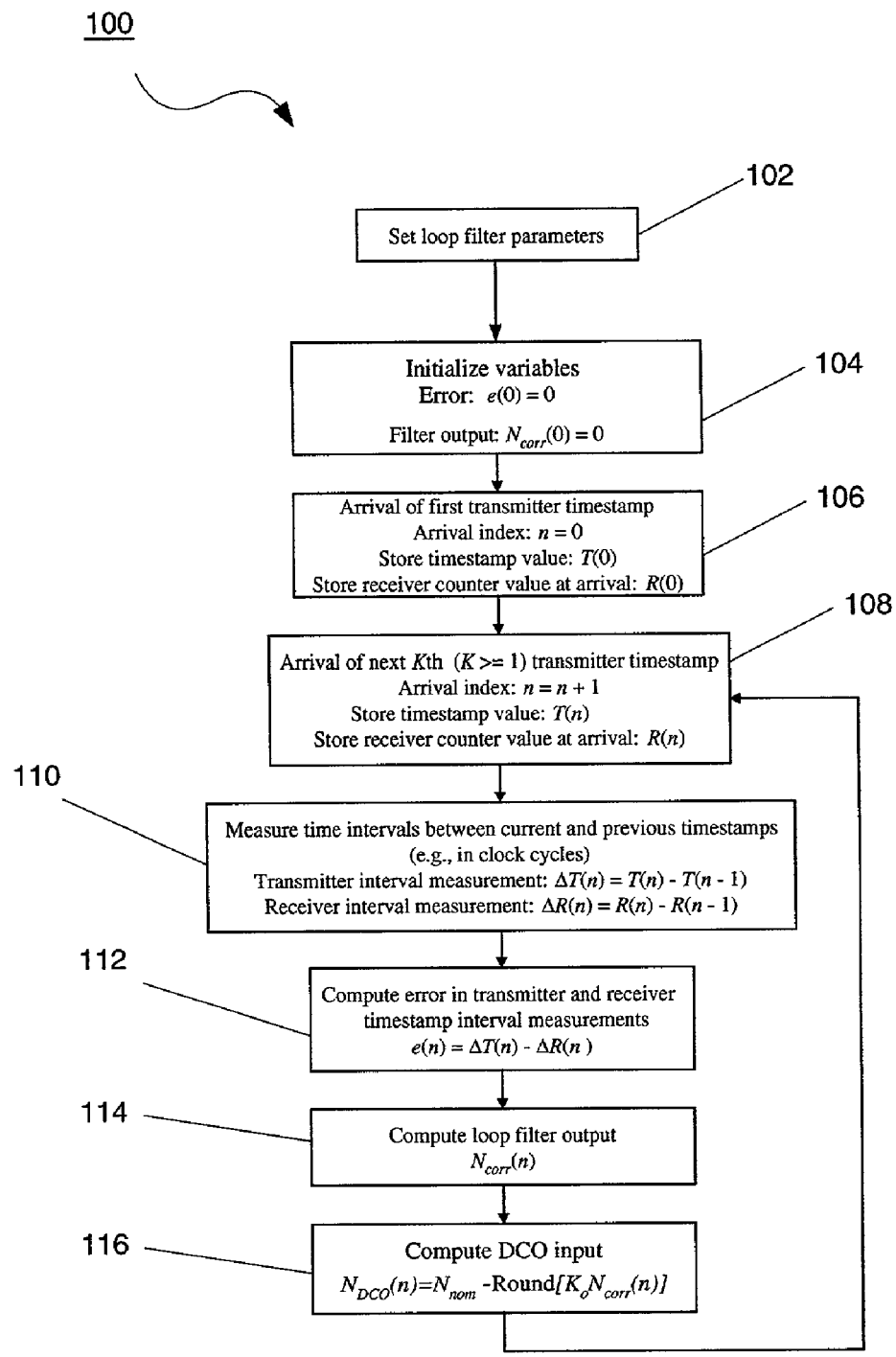
FIG. 11 is a flowchart for an algorithm which may be used for controlling a DCO to estimate a transmitter clock in accordance with the present invention.

Referring to FIG. 11, a flowchart 100 for an algorithm is shown, which may be used for controlling the DCO 60 to estimate the transmitter clock. The measurement/computational instants in the flowchart 100 occur at the timestamp arrival instants at the receiver. Specifically, in step 102, the loop filter parameters are set. In step 104, the variables $e(0)$ and $N_{corr}(0)$ are initialized. In step 106, a first timestamp arrives from the transmitter, and the timestamp and receiver pulse counter values are stored. In step 108, a next timestamp arrives from the transmitter, and the timestamp and receiver pulse counter values are stored. In step 110, the time intervals between current and previous timestamps are measured. In step 112, the error between transmitter and receiver timestamp interval measurements are computed. In step 114, the output of the loop filter 58 is computed. In step 116, the output of the DCO 60 is computed. Steps 108 through 116 are repeated for every Kth (where $K \geq 1$) subsequently arriving timestamp.

Figure 12:
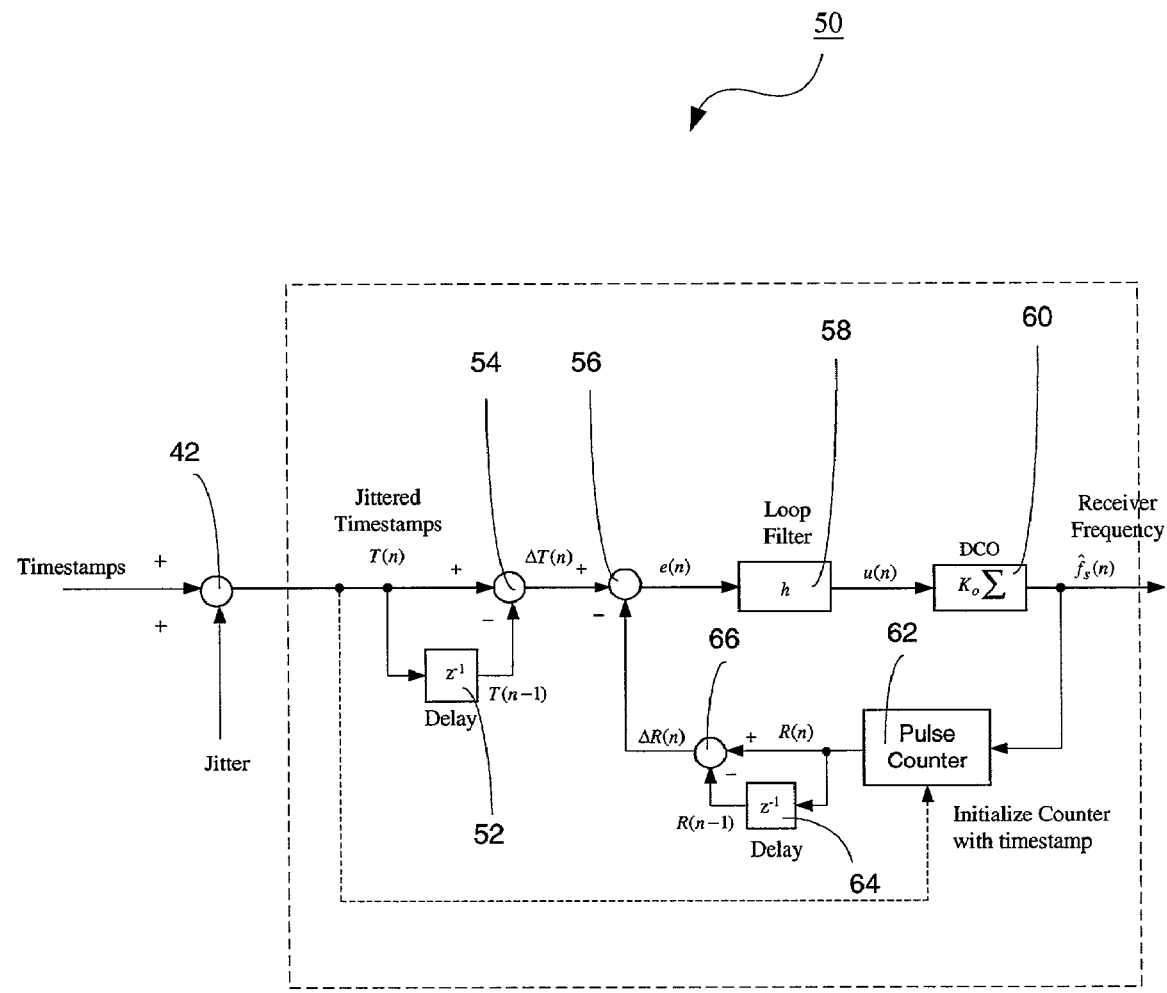
FIG. 12 shows the operation of the improved PLL shown in FIG. 4 as it is used for data playout at a receiver in accordance with the present invention.

Referring to FIG. 12, the operation of the improved PLL 50 may be described as it is used for data playout at the receiver. Initially, the improved PLL 50 waits for the first timestamp to arrive. When the first timestamp arrives it is loaded into the pulse counter 62. From this point onwards, the improved PLL 50 starts to operate in a closed-loop fashion. That is, each time the Kth ($K \geq 1$, where K is a downsampling parameter) timestamp arrives (i.e., at sampling instant $n = 1, 2, 3, \ldots$), the difference $\Delta T(n)$ between the value $T(n)$ and the value at the previous sampling instant $T(n-1)$ is determined. The difference $\Delta T(n)$ is then compared to the timestamp inter-arrival time $\Delta R(n) = R(n) - R(n-1)$ measured and computed by the pulse counter 62, the second delay element 64, and the third differencing element 66 to give an error term $e(n) = \Delta T(n) - \Delta R(n)$. This error term is sent to the loop filter 58, whose output controls the frequency of the DCO 60. The output of the DCO 60, in turn, provides the clock frequency of the receiver and also drives the pulse counter 62. After a while the error term, $e(n)$, converges to zero, which means that the improved PLL 50 has locked onto the incoming time base (i.e., the time base of the transmitter). The requirements on stability and frequency accuracy of the recovered clock depend on the type of application at the receiver (e.g., DS1, DS3, E1, and/or E3 traffic).

Figure 13:
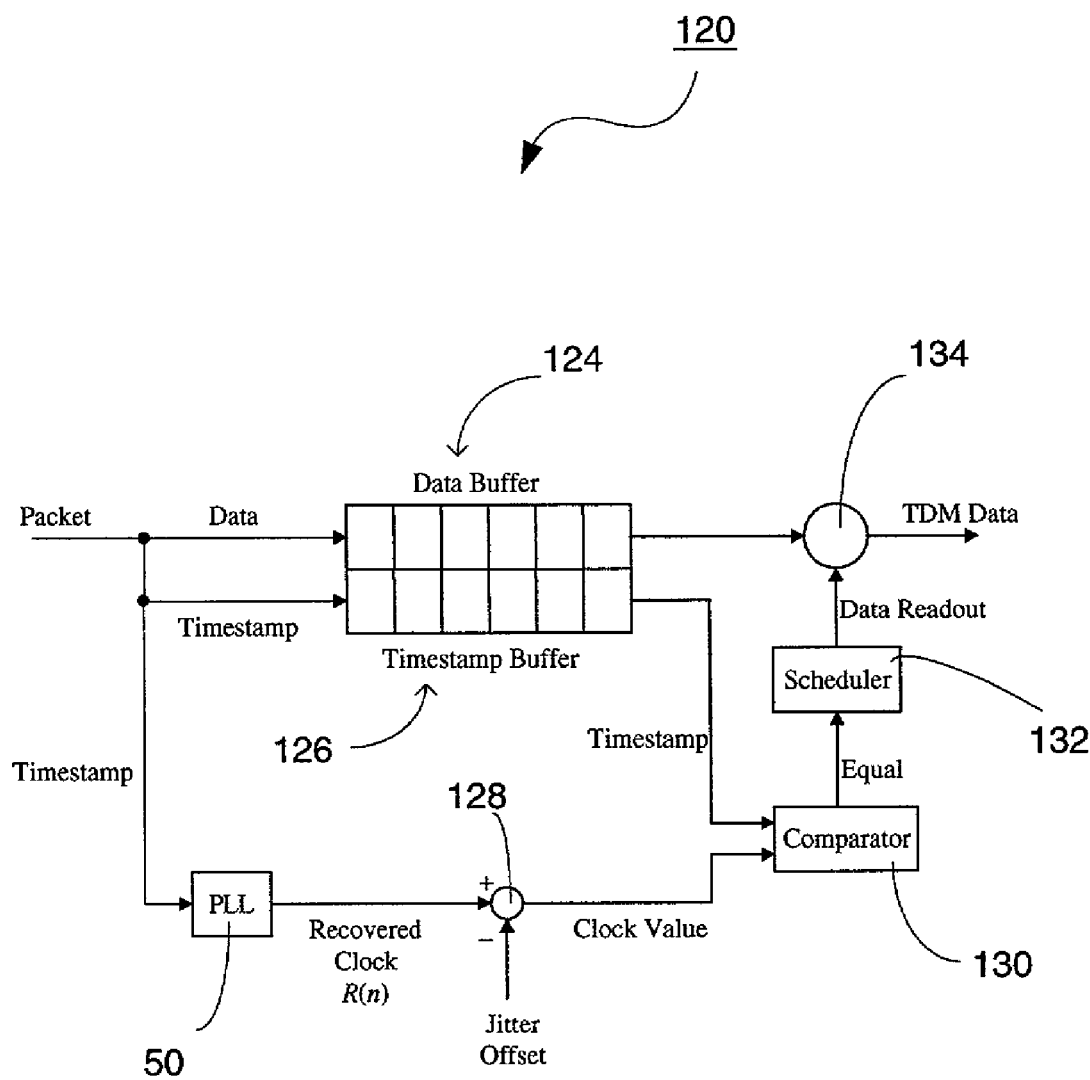
FIG. 13 shows a receiver for implementing a data playout process using a recovered clock signal R(n) in accordance with the present invention.

The recovered clock frequency at the receiver that drives the pulse counter 62 may also be used for data playout purposes in, for example, a packet/TDM interworking unit, a video decoder, a voice decoder, etc. Referring to FIG. 13, there is shown a receiver 120 for implementing a data playout process using the recovered clock signal (i.e., the value of the pulse counter 62) $R(n)$ in accordance with the present invention. For each data packet (carrying a timestamp) that arrives from the network, the timestamp $T(n)$ is read and sent to the improved PLL 50. The data (i.e., packet payload) is then placed in a receiver data buffer 124. A copy of the timestamp is also stored in a timestamp buffer 126.

The monotonically increasing clock signal (i.e., the pulse counter value), $R(n)$, which is differenced with a jitter offset at differencing element 128, is periodically compared with the stored timestamps via comparator 130. When the clock value, $R(n)$, is equal to a timestamp, the associated payload of the data packet is sent to the receiving application (e.g., as TDM data) through switch 134 at the time indicated by the timestamp. The jitter offset should account for the maximum jitter amplitude and packet loss rate that is allowed in the system. The size of the receiver buffer 124 can be at least the size of the statistical bound of the delay variations.

Figure 14:
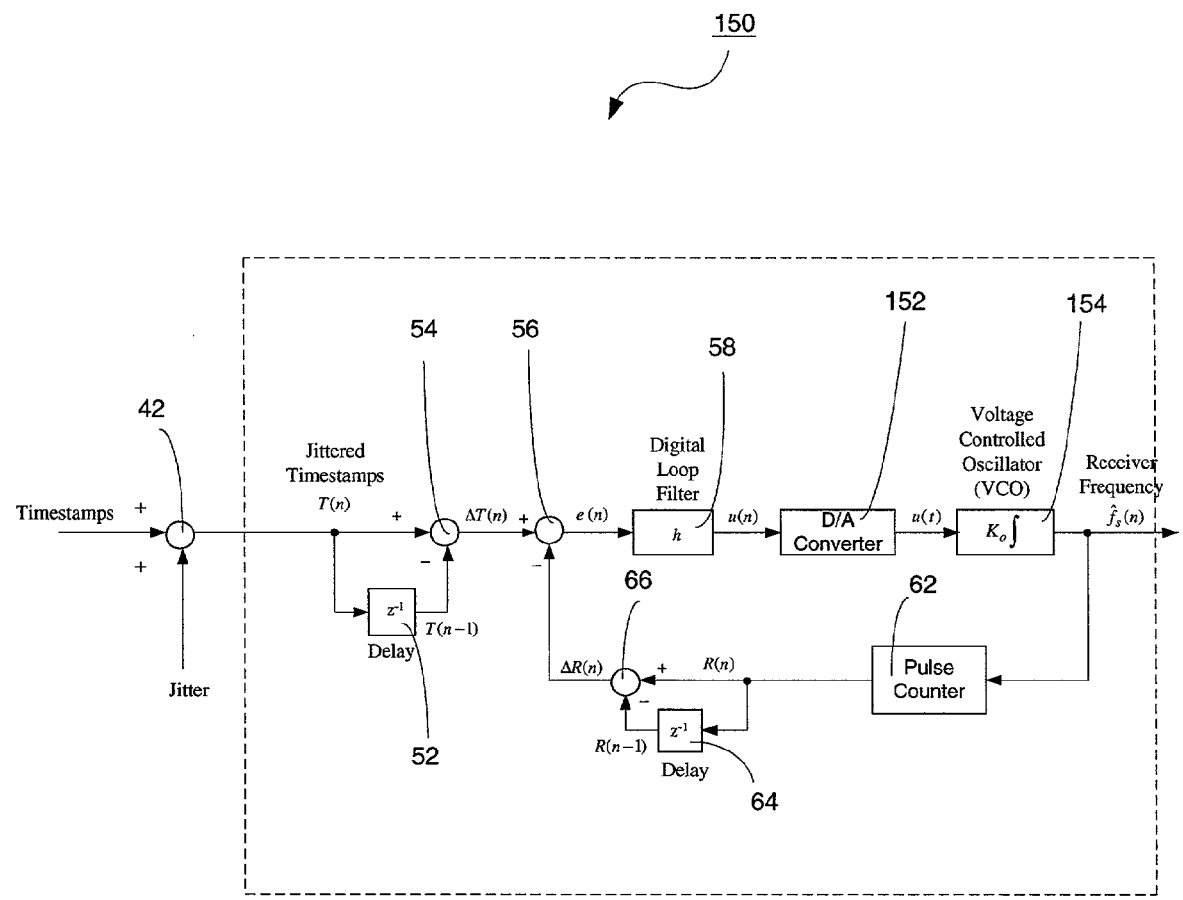
FIG. 14 shows an improved PLL which uses a voltage controlled oscillator (VCO) in accordance with the present invention.

As indicated above, the improved PLL 50 is preferably implemented using a DCO instead of a VCO. The use of digital circuitry and/or digital signal processing techniques has many inherent advantages including the ease of implementation/fabrication, a minimum number of adjustments, absence of drifts due to temperature and aging, increased reliability, etc. However, the PLL can easily be adapted to use a VCO. For example, referring to FIG. 14, there is shown an improved PLL 150 which uses a VCO in accordance with the present invention. That is, the DCO 60 in FIGS. 4, 9, 10, and 12 is replaced in FIG. 14 with a digital-to-analog (D/A) converter 152 and a VCO 154.

Figure 15:
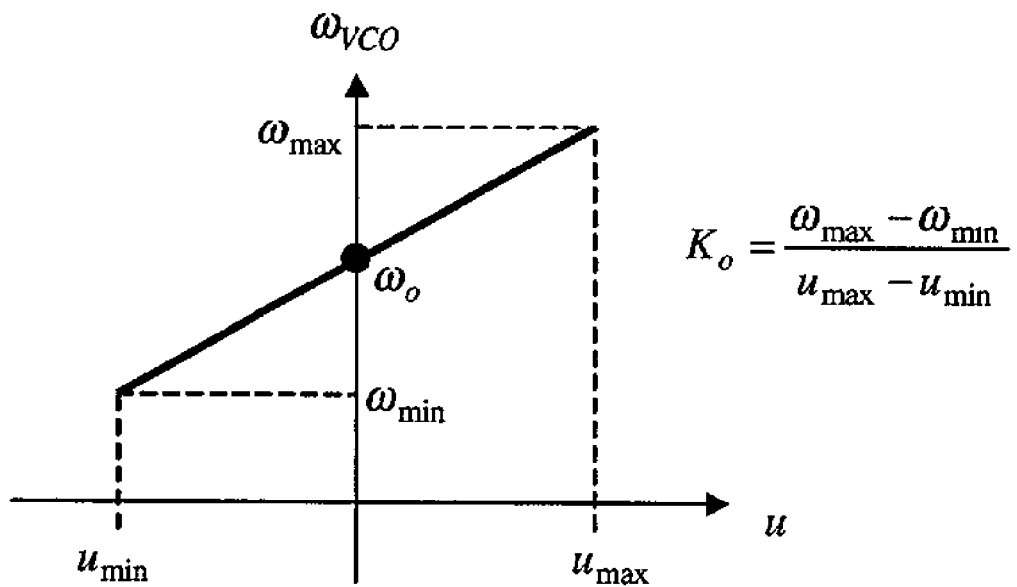
FIG. 15 is a graph of a typical characteristic curve of the VCO shown in FIG. 14.

The angular frequency of the VCO 154 may be defined by:

$$\omega_{VCO}(t) = \omega_o + K_o u(t),$$

where $\omega_o$ is the center (angular) frequency of the VCO 154, $K_o$ is the gain of the VCO 154, and $u(t)$ is an analog control signal converted from digital format by the D/A converter 152. A typical characteristic curve of the VCO 154 is illustrated in FIG. 15.

At this point it should be noted that the improved PLL's 50 and 150 as described above typically involve the processing of input data and the generation of output data to some extent. This input data processing and output data generation may be implemented in hardware or software. For example, specific electronic components may be employed in a receiver or similar or related circuitry for implementing the functions associated with the improved PLL's 50 and 150 as described above. Alternatively, one or more processors operating in accordance with stored instructions may implement the functions associated with the improved PLL's 50 and 150 as described above. If such is the case, it is within the scope of the present invention that such instructions may be stored on one or more processor readable media, or transmitted to one or more processors via one or more signals.

In summary, the present invention encompasses a clock synchronization technique where a transmitter periodically sends explicit time indications or timestamps to a receiver to enable the receiver to synchronize its local clock to the transmitter's clock. The timestamp-based technique described herein has a very simple implementation and yet gives very good clock synchronization performance.

More particularly, the present invention encompasses a novel timestamp-based PLL technique for clock synchronization over packet networks. The error signal in the improved PLL technique is defined as the difference between the inter-timestamp generation intervals (i.e., a PLL reference signal) and the inter-timestamp arrival intervals (i.e., the PLL output signal). The improved PLL technique allows for fast acquisition of input frequency, low steady-state (tracking) error, timekeeping functionality, and high jitter attenuation (or absorption), which are desirable properties for a good PLL. The improved PLL technique may be used for circuit emulation in packet networks where a receiver is required to estimate the transmitter clock frequency from timestamp arrivals at the receiver. The present invention technique is particularly suitable for clock synchronization in networks where the transmitter and receiver are not driven from a common timing reference but the receiver requires a timing reference traceable to the transmitter clock.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for synchronizing clocks in a network, the method comprising the steps of:
  receiving a first timestamp and a second timestamp each indicating a respective time instance within the network;
  delaying the first timestamp by a first delay amount;
  measuring a first time interval between the first timestamp delayed by the first delay amount and the second timestamp as determined by a first clock signal;
  delaying the first timestamp by a second delay amount;
  measuring a second time interval between the first timestamp delayed by the second delay amount and the second timestamp as determined by a second clock signal;
  generating a difference signal representing a difference between the first time interval and the second time interval; filtering the difference signal; and
  generating the second clock signal based upon the filtered difference signal such that the second clock signal is synchronized with the first clock signal.

2. The method as defined in claim 1, wherein the first delay amount and the second delay amount are substantially equal delay amounts.

3. The method as defined in claim 1, further comprising the step of:
  initializing the difference signal prior to receiving the first timestamp and the second timestamp.

4. The method as defined in claim 1, wherein the step of filtering the difference signal comprises filtering the difference signal with a low pass filter such that the second clock signal is synchronized with the first clock signal based upon the filtered difference signal.

5. The method as defined in claim 4, further comprising the step of:
  initializing the filtered difference signal prior to receiving the first timestamp and the second timestamp.

6. The method as defined in claim 1, wherein the step of generating the second clock signal comprises the step of:
  controlling the period of a digitally controlled oscillator based upon the filtered difference signal.

7. The method as defined in claim 1, wherein the step of generating the second clock signal comprises the step of:
  converting the filtered difference signal from a digital difference signal value into an analog difference signal value; and
  controlling the period of a voltage controlled oscillator based upon the analog difference signal value.

8. A computer signal embodied in a readable readable by a computing system and encoding a computer program of instructions for executing a computer process performing the method recited in claim 1.

9. An apparatus for synchronizing clocks in a network, the apparatus comprising:
  a receiver for receiving a first timestamp and a second timestamp each indicating a respective time instance within the network; and
  a phase-locked loop associated with the receiver, the phase-locked loop comprising:
    a first delay element for delaying the first timestamp by a first delay amount;
    a first differencing element for measuring a first time interval between the first timestamp delayed by the first delay amount and the second timestamp as determined by a first clock signal;
    a second delay element for delaying the first timestamp by a second delay amount;
    a second differencing element for measuring a second time interval between the first timestamp delayed by the second delay amount and the second timestamp as determined by a second clock signal;
    a third differencing element for generating a difference signal representing a difference between the first time interval and the second time interval;
    a filter for filtering the difference signal; and
    a variable oscillator for generating the second clock signal based upon the filtered difference signal such that the second clock signal is synchronized with the first clock signal.

10. The apparatus as defined in claim 1, wherein the first delay amount and the second delay amount are substantially equal delay amounts.

11. The apparatus as defined in claim 9, wherein the second differencing element initializes the difference signal prior to receiving the first timestamp and the second timestamp.

12. The apparatus as defined in claim 9, wherein the filter comprises a low pass loop filter for filtering the difference signal such that the second clock signal is synchronized with the first clock signal based upon the filtered difference signal.

13. The apparatus as defined in claim 12, wherein the loop filter initializes the filtered difference signal prior to receiving the first timestamp and the second timestamp.

14. The apparatus as defined in claim 9, wherein the variable oscillator is a digitally controlled oscillator the period of which is controlled based upon the filtered difference signal.

15. The apparatus as defined in claim 9, further comprising:
 a digitaltoanalog converter for converting the filtered difference signal from a digital difference signal value into an analog difference signal value, and wherein the variable oscillator is a voltage controlled oscillator the period of which is controlled based upon the analog difference signal value.

16. An article of manufacture for synchronizing clocks in a network, the article of manufacture comprising:
 at least one processor readable media; and
 instructions carried on the at least one processor readable media;
 wherein the instructions are configured to be readable from the at least one processor readable by at least one processor and thereby cause the at least one processor to operate so as to:
 receive a first timestamp and a second timestamp each indicating a respective time instance within the network;
 delay the first timestamp by a first delay amount;
 measure a first time interval between the first timestamp delayed by the first delay amount and the second timestamp as determined by a first clock signal;
 delay the first timestamp by a second delay amount;
 measure a second time interval between the first timestamp delayed by the second delay amount and the second timestamp as determined by a second clock signal;
 generate a difference signal representing a difference between the first time interval and the second time interval;
 filter the difference signal; and
 generate the second clock signal based upon the filtered difference signal such that the second clock signal is synchronized with the first clock signal.

* * * * *